(12) United States Patent
Burr et al.

(10) Patent No.: US 8,263,215 B2
(45) Date of Patent: *Sep. 11, 2012

(54) PERFORATED FUNCTIONAL TEXTILE STRUCTURES

(75) Inventors: Stacey B. Burr, West Lafayette, IN (US); Qaizar N. Hassonjee, Chadds Ford, PA (US); Roger Armitage, Cirencester (GB)

(73) Assignee: Textronics, Inc., Wilmington, DE (US)

( * ) Notice: Subject to any disclaimer, the term of this patent is extended or adjusted under 35 U.S.C. 154(b) by 13 days.

This patent is subject to a terminal disclaimer.

(21) Appl. No.: 12/853,340

(22) Filed: Aug. 10, 2010

(65) Prior Publication Data

US 2010/0293698 A1 Nov. 25, 2010

Related U.S. Application Data

(62) Division of application No. 11/570,308, filed as application No. PCT/IB2005/001681 on Jun. 15, 2005, now Pat. No. 7,781,051.

(60) Provisional application No. 60/581,048, filed on Jun. 18, 2004.

(51) Int. Cl.
*A01K 1/15* (2006.01)
*B23B 5/00* (2006.01)
*D03D 15/08* (2006.01)
*D04H 1/00* (2006.01)
*B32B 3/10* (2006.01)
*B32B 37/12* (2006.01)
*B32B 38/04* (2006.01)
*H05B 3/34* (2006.01)

(52) U.S. Cl. ........ 428/221; 442/183; 442/184; 442/329; 428/131; 156/60; 156/66; 156/229; 2/905; 219/211

(58) Field of Classification Search ........... 2/223, 243.1; 428/99, 123, 130, 131, 136, 137, 156; 128/102.1, 128/873; 442/181, 327
See application file for complete search history.

(56) References Cited

U.S. PATENT DOCUMENTS 3,485,706 A 12/1969 Evans
4,822,663 A 4/1989 Reott
(Continued)

FOREIGN PATENT DOCUMENTS

DE 10020651 11/2000
(Continued)

OTHER PUBLICATIONS

E.R. Post, et al., *E-broidery: Design and Fabrication of Textile-Based Computing* (2000), vol. 39, Nos. 3 and 4, IBM Systems Journal.

*Primary Examiner* — Jennifer A Steele

(74) *Attorney, Agent, or Firm* — COnnolly Bove Lodge & Hutz LLP

(57) ABSTRACT

The invention provides a functional stretch laminate composite puckered fabric which is robust, laundry-durable and adaptable for securing about any three dimensional body, and a method for forming such puckered fabric. The functional stretch laminate fabric is provided with at least one functional element which can conduct electricity, conduct light, provide electromagnetic fields or provide shielding from electromagnetic fields. In addition, at least one via is provided in the functional stretch laminate allowing the functional element to extend or loop outwardly from the at least one via when the laminate is in a relaxed or unstretched state. Generally, the functional stretch laminate fabric is sufficiently robust for incorporation into garments and for applications in so-called wearable electronics.

29 Claims, 6 Drawing Sheets

U.S. PATENT DOCUMENTS

| | | | |
|---|---|---|---|
| 4,822,863 A | 4/1989 | Ford | |
| 5,030,495 A | 7/1991 | Neu | |
| 5,228,032 A | 7/1993 | Mertelmeier et al. | |
| 5,433,697 A * | 7/1995 | Cox | 602/19 |
| 5,543,012 A * | 8/1996 | Watson et al. | 156/440 |
| 5,906,004 A | 5/1999 | Lebby et al. | |
| 6,210,771 B1 | 4/2001 | Post et al. | |
| 6,315,009 B1 | 11/2001 | Jayaraman et al. | |
| 6,341,504 B1 * | 1/2002 | Istook | 66/172 E |
| 6,381,482 B1 | 4/2002 | Jayaraman et al. | |
| 6,687,523 B1 | 2/2004 | Jayaramen et al. | |
| 2001/0001300 A1 | 5/2001 | Tolbert et al. | |
| 2001/0019050 A1 | 9/2001 | Rock et al. | |
| 2001/0029142 A1 | 10/2001 | Martin | |
| 2002/0086204 A1 | 7/2002 | Rock et al. | |
| 2004/0127132 A1 | 7/2004 | Berman et al. | |
| 2005/0061802 A1 | 3/2005 | Rock | |

FOREIGN PATENT DOCUMENTS

| | | |
|---|---|---|
| GB | 559322 | 2/1944 |
| GB | 2170680 | 8/1986 |
| GB | 2261290 | 5/1993 |
| JP | 42-15347S A | 8/1992 |
| WO | WO-9964657 | 12/1999 |
| WO | WO-0020202 | 4/2000 |
| WO | WO-0245946 | 6/2002 |
| WO | WO-03087451 A2 | 10/2003 |

* cited by examiner

PERFORATED FUNCTIONAL TEXTILE STRUCTURES

CROSS-REFERENCE TO RELATED APPLICATION

This application is a divisional of U.S. Ser. No. 11/570,308 filed on Dec. 8, 2006, now U.S. Pat. No. 7,781,051, filed as a national stage entry of PCT/IB2005/001681 on Jun. 15, 2005, which claimed priority from U.S. Provisional Application No. 60/581,048, filed Jun. 18, 2004.

FIELD OF THE INVENTION

The present invention relates to flexible and elastic textile structures, adapted for securing about a three dimensional object, having the ability to, for example, conduct electricity, conduct light, and to provide or influence electromagnetic fields.

BACKGROUND OF THE INVENTION

Different types of flexible and elastic textile structures having an ability to conduct electricity or to influence electromagnetic fields have been disclosed for certain medical and physiological monitoring applications. For example, U.S. Pat. No. 6,341,504 to Cynthia L. (stook (assigned to VivoMetrics®, Inc., Ventura, Calif., USA) discloses a composite elastic fabric construction for apparel applications of the type used in physiological monitoring wherein the stretching and stretch-recovery of the composite elastic fabric changes the inductance of an electrically conductive curved wire affixed to or incorporated in the composite fabric. VivoMetrics® Inc. is the maker the Lifeshirt™, which incorporates the flexible electrically conductive textile structure of Istook and is used primarily for physiological monitoring and other ambulatory wearer measurement capabilities. In general, the Istook structure requires that one or more conducting wires be stitched to the face of an elastic band structure in order to form the curved wire geometry for the intended application.

PCT publication WO 2003/087451A2 to Vikram Sharma ("Sharma") discloses a tubular knit fabric system comprising an electrically insulating yarn, a stretch yarn, and a "functional" yarn knitted together to form a tubular knit fabric. In Sharma, the functional yarn is electrically conductive, having a resistance of 0.01 ohm/meter to 5000 ohm/meter. The "functional" yarn is embedded within the tubular knit in a continuous spiral that extends the length of a sleeve formed from the tubular knit. Body portions, such as limbs, are surrounded by a portion of the tubular fabric to measure physiological signs. In addition, these tubular knit fabrics disclosed by Sharma are adaptable for use in a narrow elastic band configuration in which the functional yarns serve as parallel conductors for electrical signals. A disadvantage of Sharma's narrow elastic band structures is that the functional yarns or wires must be knitted simultaneously into the structure with all other components.

In addition to electrically conducting elements, optical fibers for light conduction have been disclosed for incorporation into garments. For example, U.S. Pat. No. 6,315,009 to Sundaresan Jayaraman et al. (assigned to Georgia Tech Research Corp.) ("Jayaraman") discloses a full-fashioned continuously woven garment consisting of a comfort component and sensing component of the base fabric. According to Jayaraman, the sensing component can be an electrically conductive component or a penetration sensing component. For example, the penetration sensing component can be an optical conductor such as plastic optical fiber. A disadvantage of the Jayaraman construction is the need to simultaneously weave directly into the tubular fabric or garment the elastic yarn and the functional component(s), e.g. plastic optical fiber.

The above references incorporate functional components, such as electrical conductors, through the use of fabric structures of a woven or knitted type. Such functional components can have poor compatibility with conventional textiles. Moreover, such functional components generally cause difficulties in conventional fabric forming processes (e.g. weaving, knitting, seamless knitting). For example, wires, small cables, and plastic optical fibers often match poorly with typical textile fibers because of their fragility, elastic modulus, extensibility, and tensile strength. In particular, such disadvantages are notable where elastic recovery and flexibility from the structure or garment is desired and where the ability to wash or launder a garment is desired. Thus, flexible and elastic textile structures are needed that can overcome one or more deficiencies of the prior art.

The art continues to seek structures with elements able to conduct electricity, conduct light, or influence electromagnetic fields for use in certain medical and/or physiological monitoring applications, as well as industrial and interconnect applications, wherein the structures do not have at least one of the deficiencies mentioned above. An ability to provide a launderable garment that incorporates functional elements into flexible textile-like structures without the need to knit or weave such elements would be highly desirable.

SUMMARY OF THE INVENTION

The present invention relates to a perforated functional stretch laminate with a substantially puckered appearance. The perforated functional stretch laminate includes: first and second outer layers of a fabric, paper or film; at least one stretch and recovery element and at least one functional element co-extending with the stretch and recovery element; and an adhesive composition for bonding the stretch and recovery element and the functional element between the outer layers; wherein the substantially puckered appearance results when the stretch and recovery element is in a relaxed or unstretched state, and wherein a portion of the at least one functional element extends or loops outwardly from at least one hole or via provided in the functional stretch laminate. The functional stretch laminate of the invention can be conductive and can, for example, conduct electricity, conduct light, or provide an electromagnetic field.

The present invention further relates to a method for preparing a perforated functional stretch laminate with a substantially puckered appearance. The method includes: providing a length of a first piece of inextensible material having a first surface and a second surface; extending and fixing at least one length of a stretch and recovery element to at least 50% of its undeformed recoverable extension limit, and extending and fixing at least one length of a functional element coextensively with the stretch and recovery element, and further securing the extended lengths of the stretch and recovery element and the functional element to the first surface of said first piece of inextensible material along a substantial portion of the fixed length thereof; providing a second piece of inextensible material having a first surface and second surface, and securing said second piece of inextensible material either to the stretch and recovery element or to the first surface of said first piece of inextensible material along a substantial portion of the length thereof coextending with said stretch and recovery element to form the functional stretch laminate; and relaxing the extended length of said stretch and recovery element substantially and allowing the functional stretch laminate to pucker, such that a portion of the at least one functional element extends or loops outwardly from at least one hole or via provided in the functional stretch laminate.

BRIEF DESCRIPTION OF THE DRAWINGS

The present invention will be described in the following detailed description with reference to the following drawings:

in FIG. 4A the composite fabric is under an elongating tension, and in FIG. 4B the composite fabric is relaxed and under no elongating tension;

in FIG. 5E two loops are shown extending through an elongated slot-shaped perforation and in FIG. 5F four loops are shown each extending through an individual perforation hole;

in FIG. 6A the functional stretch laminate is under an elongating tension, and in FIG. 6B the functional stretch laminate is relaxed an under no elongating tension;

DETAILED DESCRIPTION OF THE INVENTION

Figure 1:
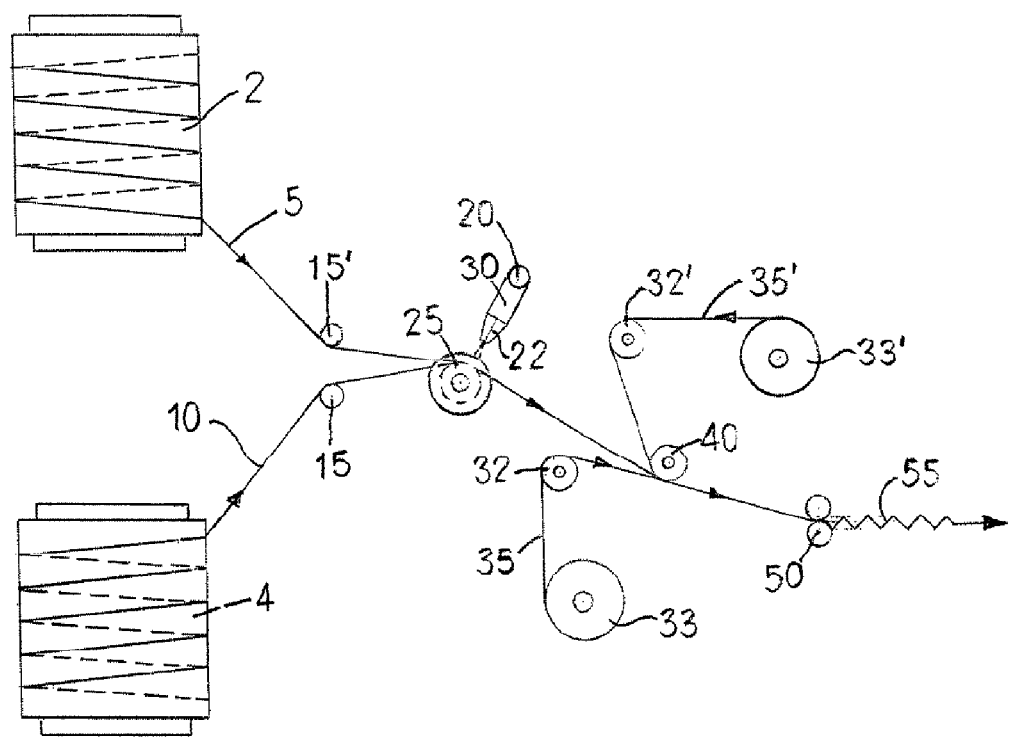
FIG. 1 is a schematic representation in side elevation of an apparatus suitable for making a functional stretch laminate of the invention.

The invention includes a functional stretch laminate that may be a composite fabric with a substantially flat surface appearance, which is also able to take on a substantially puckered appearance. The stretch laminate can be conductive, robust, laundry-durable, and adapted for securing about any three dimensional body.

The functional stretch laminate of the invention generally includes:

(a) first and second outer layers of nonwoven, knitted, or woven fabric, paper or film, wherein each layer has an inside (or first) surface and an outside (or second) surface with respect to the composite fabric;

(b) at least one threadline of a stretch and recovery element, such as a fiber having elastomeric properties sandwiched between the outer layers;

(c) at least one functional element also sandwiched between the outer layers;

(d) an adhesive composition for bonding the first and second outer layers, or for bonding the first and second outer layers to the stretch and recovery element or for bonding the first and second outer layers to the functional element; and (e) at least one hole or via, which allows at least one functional element to extend or loop outwardly from the functional stretch laminate when the laminate is in a relaxed or unstretched state.

The two outer layers of nonwoven, knitted, or woven fabric, paper or film can, in one embodiment, be of substantially equal width.

The elastomeric fiber can, in one embodiment, be at least 400 decitex, wherein the number of threadlines and fiber decitex are in a relationship such that the retractive force of the stretchable fabric is at least 0.22 lb/inch (38.9 g/cm).

In addition, the adhesive composition can, in one embodiment, comprise between about 8 and 70% of the laminate by weight, and although applied to only partially cover the inside surface of at least one outer layer, such adhesive may penetrate to the outside of each outer layer to an extent less than about 10%, based on the surface area of each outer layer.

Further, the functional element can be substantially parallel or coextensive with the stretch and recovery element.

The invention further provides a method for making a functional stretch laminate with a puckered appearance which includes the steps of:

providing a length of a first piece of inextensible material having a first surface and a second surface;

extending and fixing at least one length of a stretch and recovery element to at least 50% of its undeformed recoverable extension limit, and extending and fixing at least one length of a functional element coextensively with the stretch and recovery element;

securing the extended lengths of the stretch and recovery element and the functional element to the first surface of said first piece of inextensible material along a substantial portion of the fixed length thereof;

providing a second piece of inextensible material having a first surface and second surface, and securing said second piece of inextensible material to the stretch and recovery element, the functional element, or the first surface of said first piece of inextensible material along a substantial portion of the length thereof coextending with said stretch and recovery element to form the functional stretch laminate; and relaxing the extended length of said stretch and recovery element substantially and allowing the functional stretch laminate to pucker such that at least one functional element extends or loops outwardly from at least one via provided in the functional stretch laminate. This method may further comprise the step of attaching at least one connector to the functional stretch laminate, wherein said connector is adaptable for connecting the at least one functional element in the laminate to a source selected from the group consisting of electricity and radiation. Radiation may be photonic radiation selected from those wavelengths of light employed in fiber optic networks for data communication.

In one embodiment of the inventive method, the outer layers are substantially planarized and secured in place when the at least one stretch and recovery element and the at least one functional element are secured to such layers. As used herein, the term "planarizing" means to bring a portion of a fabric, a web, or a film into a substantially planar and unwrinkled configuration without puckers.

As used herein, suitable "substantially inextensible materials" include nonwoven fabrics, woven fabrics, knit fabrics, papers, oriented and unoriented films, including variants of the foregoing with metallic coatings. These woven, nonwoven, and knit fabrics may comprise staple or continuous fibers, including those fibers from polyolefins, polyesters, polyamides, and polyperfluorinated olefins. Suitable films may comprise polymers, including polyester, polyolefins, polyperfluorinated olefins, and polyamides. The fabrics or films of the outer layers of the functional stretch laminate can include any of the above-mentioned substantially inextensible materials.

As used herein, suitable "stretch and recovery elements" include at least spandex or elastane yarns, films, or coatings (for example, LYCRA®spandex). Suitable stretch and recovery elements can further include materials such as a polyester bicomponent fiber, for example, Type 400 brand poly(ethylene terephthalate)//poly(trimethylene terephthalate) bicomponent fiber, commercially available from Invista S. à r. l. ("T400"). Stretch and recovery elements can also include materials that provide both stretch and recovery and functional properties, such as the conductive stretchable composite yarns disclosed in PCT publication WO 2004/097089 A1, the entire disclosure of which is incorporated herein by reference (hereinafter referred to as "electrically or optically functional composite yarns that comprise an elastic member surrounded by at least one functional covering filament").

Suitable stretch and recovery elements can have a breaking elongation of over 200%, such as over 400%. In addition, such materials can recover immediately to their original length when tension is relaxed.

As used herein, the term "functional" means elements or materials that exhibit electrical, optical, magnetic, mechanical, chemical, and/or thermal energy properties.

Examples of "functional materials" include, but are not limited to, materials that present: electrical function (e.g., electrical conductivity, heating, piezoelectric, electrostrictive, electrochromic activity); optical function (e.g., photonic crystal fibers, photoluminesce, luminescence, light transmission, reflection); magnetic function (e.g., magnetostrictive activity); thermoresponsive function (e.g., shape memory polymers or alloys); and sensorial function (e.g., chemical, bio, capacitive). Such functional materials can be included in functional elements used in embodiments of the present invention.

As used herein, suitable "functional elements" include: metallic wires of the insulated or noninsulated variety, having one or more conductors, such as litz wire, tinsel wire, or stranded conductors for high frequency use; single stranded metallic wires having circular or noncircular cross-sections, such as, ribbon wire; metallic coated polymeric wires and films, such as, Xstatic® yarns and metallized MYLAR® (from DuPont-Teijin Films, Hopewell, Va., USA); inherently conductive polymer fibers such as those from polypyrrole; plastic optical fiber from polymethyl methacrylate, such as, CROFON®; and silica glass optical fibers of the multi-mode or single-mode variety suitable for fiber optic networks based on Ethernet, Fiber Channel, FDDI, ATM and Token Ring protocols. Suitable functional elements also include electrically conductive composite yarns that comprise an elastic member surrounded by at least one conductive covering filament, as well as the elastomeric compositions disclosed in U.S. Provisional application Ser. No. 60/562,622, filed Apr. 15, 2004, the entire disclosure of which is incorporated herein by reference (hereinafter referred to as "electrically conductive elastomeric compositions that exhibit variable resistance").

As used herein, the term "adapted for securing about any three dimensional body" means the functional stretch laminate is flexible and elastic allowing conformance to any shape. Particularly, where the functional stretch laminate is a garment or a component of a garment or other wearable placed on at least a portion of a body, the laminate is at least as adaptable as the garment or wearable in conforming to the three dimensional shape of the body. Inherent in the adaptable conformance of the laminate to any three dimensional body is a robustness of the laminate structure to maintain the performance of the laminate's functional element in the presence of any motion of the three dimensional shape to which the laminate is conforming.

As used herein, the term "laundry durable" means the functional stretch laminate is at least washable. Particularly, where the functional stretch laminate is a component of a washable garment or other washable wearable placed on the body, the laminate structure maintains the performance of the laminate's functional element after multiple washing or laundry cycles. For example, maintaining functional element performance after at least one wash cycle would be "laundry durable."

As used herein, the term "conductive" means at least a portion of the stretch laminate conducts electricity, conducts light, or is able in provide an electromagnetic field, or is able to provide shielding from electromagnetic fields.

As used herein, the term "substantially parallel or coextensive" means that the stretch and recovery element(s) and functional element(s) extend lengthwise in the same direction of the functional stretch laminate (also known as the "machine direction") without contacting an adjacent stretch and recovery element or functional element. Such substantially parallel or coextensive elements can be, in at least one embodiment, substantially equidistant from the other stretch and recovery elements(s) and/or functional elements(s) along their length in the direction perpendicular to the direction in which they extend. For example, when a stretch and recovery element extends in the machine direction of the functional stretch laminate, then a substantially parallel or coextensive functional element also extends in the machine direction, and both elements are substantially equidistant from each other in the direction perpendicular to the machine direction at points along their length. The term "substantially parallel or coextensive" also includes those situations where both the stretch and recovery element and functional element are uniformly tensioned in the same direction (such as when both are uniformly tensioned in the machine direction).

The functional stretch laminate of the invention, in one embodiment, is a composite having varying amounts of puckering, and includes two outer layers of nonwoven fabric and an inner "layer" comprised of at least one functional element and two or more substantially parallel or coextensive elastomeric fibers (stretch and recovery elements) of substantially equal decitex, which are capable of complete recovery from extensions as great as 300%. The elastomeric fibers are substantially relaxed in the absence of externally applied forces. In addition, in a further embodiment, the elastomeric fibers may be equally spaced from each other in the direction perpendicular to their length.

Nonwoven fabrics suitable for making functional stretch laminates of the invention can have a basis weight ranging from about 10 to about 100 grams/(meter)$^2$, such as from about 10 to about 30 grams/(meter)$^2$. Many types of nonwoven fabrics are suitable for use in embodiments of this invention. Representative examples include nonwovens composed of thermally bonded, spunbonded, and hydroentangled fibers. For example, they may be composed of synthetic polymeric fibers such as polyolefin, polyester, and polyamide fibers.

The functional stretch laminate of the invention comprises a middle "layer" of two or more elastomeric fibers and at least one functional element sandwiched between the outer layers of inextensible material, such as nonwoven fabrics or a films. This middle "layer" may include elastomeric fibers of at least one threadline, for example, 3.2 threadlines/cm of width wherein each threadline is at least 400 decitex. The number of threadlines per cm may, for example, be up to about 6.3. The combination of these two parameters (threadlines and dcitex) may, for example, be chosen to provide a minimum retractive force of about 38.9 (grams of force)/cm, as measured in the finished product when it is stretched at 150% of its original length.

The elastomeric fibers can be substantially parallel to the edges of the outer layer fabrics or films. One example of a suitable elastomeric fiber is Lycra® spandex fiber (a registered trademark INVISTA S.à r.l).

The functional element(s) in this middle "layer" may, in one embodiment, be a metallic wire of the insulated or uninsulated variety. For example, single conductor wire may be used. The use of more conductors per wire, such as litz wire or stranded conductors, is suitable for high frequency electrical use. A single stranded metallic wire having a circular or noncircular cross-section, such as ribbon wire, is suitable for high currents or where a more rigid puckered laminate is preferred. In addition, flat metallic wires, may be used such as the flat copper wire (insulated or non-insulated) from REA Magnet Wire Co., Fort Wayne, Ind. Certain metallic coated polymeric fibers may also be used, such as, Xstatic® yarns, which are silver plated textile nylon filaments available from Laird Sauquoit Technologies, Inc. (300 Palm Street, Scranton, Pa., 18505) under the trademark X-static® yarn. One suitable form of X-static® yarn is based upon a 70 denier (77 dtex), 34 filament textured nylon available from INVISTA S. à r. l., Wilmington, Del. as product ID 70-XS-34×2 TEX 5Z electroplated with electrically conductive silver. Another suitable conductive yarn is a metal coated KEVLAR® yarn known as ARAGON® from E. I. DuPont de Nemours, Inc., Wilmington, Del. Also useful in embodiments of the invention are members of the class of inherently conductive polymer fibers, such as those from polypyrrole. In addition, the plastic optical fiber (POF) from polymethyl methacrylate polymers may be used. Where a functional element for guiding light is desired, a POF, such as CROFON® may be used. Useful POF may, for example, be of the step-index type (SI-POF) or the graded index type (GRIN-POF) for higher speed optical communications. The class of silica glass optical fibers of either the multi-mode or single-mode variety also comprise a useful class of functional elements suitable for fiber optic networks based on Ethernet, Fiber Channel, FDDI, ATM, and Token Ring protocols.

In addition, the functional element can comprise a conductive yarn, such as of Xstatic® yarn or fiber twisted together with wire, for example, copper wire. The functional element can further comprise electrically conductive composite yarns that comprise an elastic member surrounded by at least one conductive covering filament or electrically conductive elastomeric compositions that exhibit variable resistance twisted together with Spandex and/or Xstatic® yarn.

The layers of the functional stretch laminate are bonded together by an adhesive composition. Each element in the composite should be bonded to at least one other element of the composite. For example, an adhesive may be applied to the stretch and recovery element and the functional element, and in turn those elements adhered to inner surfaces of the outer layers. As another example, an adhesive may be applied to an inner surface of one of the outer layers. The adhesive composition can, for example, constitute from about 8% to 70% of the weight of the composite fabric. Adhesive content in the functional stretch laminate above these levels may, in certain circumstances, be disadvantageous, as the fabric may bond to itself. Suitable adhesive compositions can, for example, be hot melt adhesives, such as styrene-based block copolymers, including styrene/isoprene and styrene/butadiene block copolymers. Bonding by other methods may be possible, such as flame lamination and laser or ultrasonic welding, if such techniques can be carried out without harming the functional element and the stretch and recovery element.

The functional stretch laminate can, for example, be prepared in a method whereby uniformly tensioned elastomeric filaments are spaced at substantially equal distances apart and are of substantially equal decitex, for example, no less than 400 decitex per filament, such as about 2,200 dtex threadlines fed in together. These elastomeric filaments are placed between two layers of fabric, such as nonwoven fabric. In one embodiment, at least 3.15 filaments (threadlines) per cm of width are provided. The threadlines can be substantially parallel to each other and to the edges of the nonwoven fabrics. The three layers are bonded with an adhesive, which can be followed by removing the tension immediately after bonding. This method can produce a puckered fabric having a substantially uniform flat surface appearance which results from small substantially uniform puckers.

The number of functional elements per inch of width of laminate material is not limited and can, for example, range from 1 to 20, such as from 5 to 10.

Figure 2:
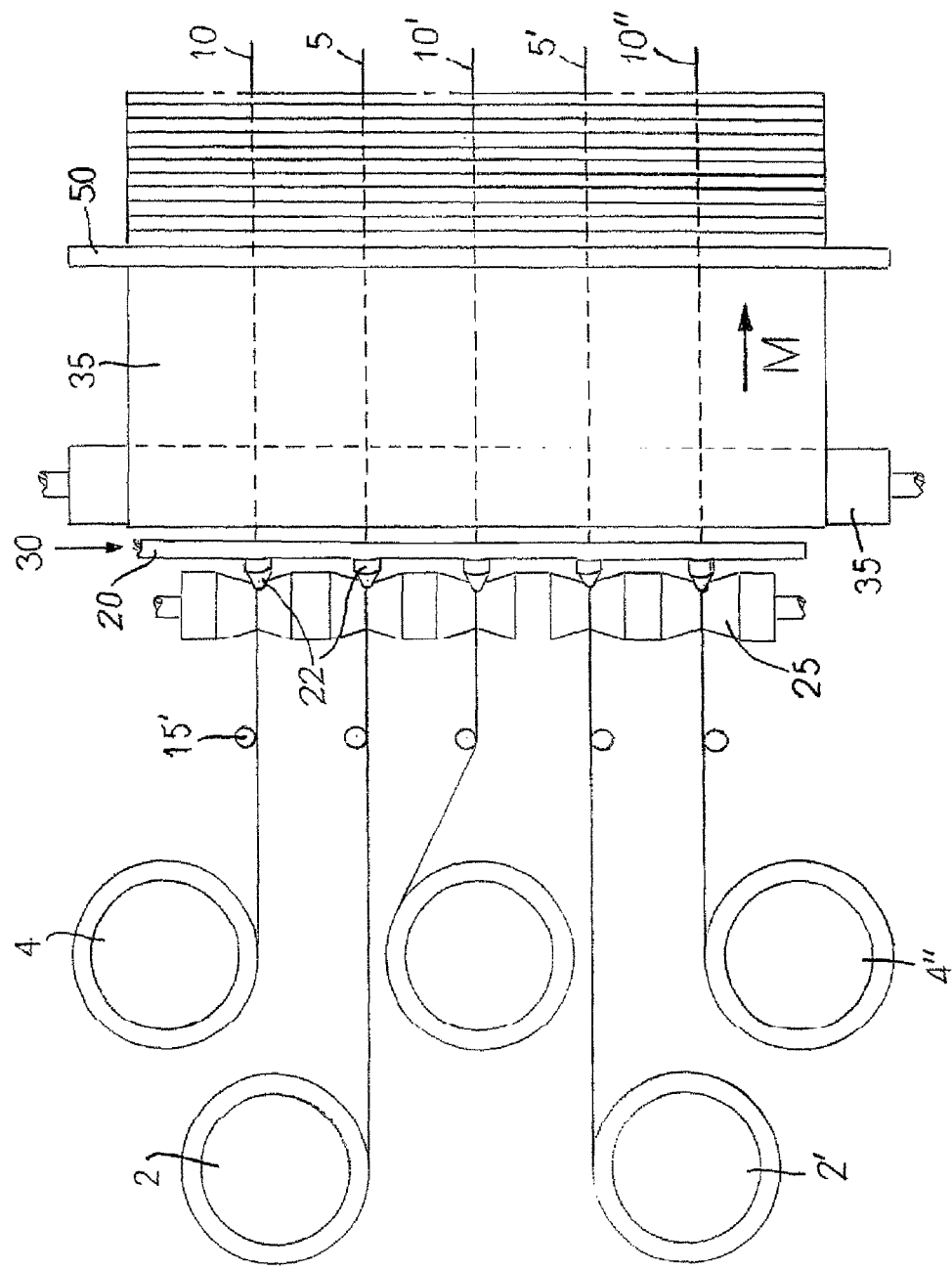
FIG. 2 is a schematic representation in top plan view of a portion of an apparatus for making a functional stretch laminate of the invention.

The apparatus schematically represented in side elevation in FIG. 1 may be used in the process of making functional stretch laminates falling within the scope of the present invention. FIG. 1 shows a single supply roll 2 of functional element 5 (a copper wire, for example) along with a single supply roll 4 of elastomeric filaments 10. However, a plurality of supply rolls and functional elements is also contemplated (see, for example, FIG. 2, which shows supply rolls 2 and 2' of functional element 5 and 5' and supply rolls 4, 4', and 4" of elastomeric filaments 10, 10', and 10"). The elastomeric filaments can be uniformly tensioned between roll 15 and nip rolls 50 to provide greater than 50% elongation. A functional element can be uniformly tensioned between roll 15' and nip rolls 50 to provide stability but generally such functional element 5 is not substantially elongated. In FIG. 1, the single functional element 5 and the single elastomeric filament 10 are shown as being side-by-side and may be separated on any pitch over the roll surface of guide plate 25. Where multiple elastomeric fibers and multiple functional elements are supplied to the process (see FIG. 2 where the machine direction, M, of the process is indicated), it is understood that the guide plate 25 (in FIGS. 1 and 2) or an equivalent spacing means can provide the position and pitch of each elastomeric fiber and functional element. In FIG. 1, a layer of substantially parallel elastomeric fiber 10, stretched not less than 50%, and functional element 5, are shown as being placed on top of one of the layers of nonwoven fabric 35 supplied from rolls 33. An adhesive 30, for example, a hot melt adhesive, is applied onto the elastomeric fiber and functional element and bottom nonwoven layer via conduit 20. The other layer of nonwoven 35', supplied from rolls 33', is then placed on top of the adhesive-treated combination at roll 40 and the combined structure is bonded by heat and pressure at nip rolls 50 while the elastomeric fibers 10 remain in the stretched condition. Alternatively, the adhesive 30 can be applied to the elastomeric fiber and functional element prior to their placement between layers of nonwoven fabric. When the bonding is completed, the uniform tension is substantially completely released and the composite fabric relaxes to form the desired puckered structure 55. Arrow D indicates direction of travel of the produced structures 55 away from the nip rolls 50.

The hot melt adhesive 30 (see, for example, FIG. 2) can be applied in several different ways. In one method, the melted adhesive can be deposited as a discontinuous web from a spray nozzle (one such nozzle 22 is shown at the end of adhesive conduit 20 in FIG. 2), by a process known as melt blowing. In another method, the melted adhesive can be deposited as a solid stream from a nozzle that moves in a spiral pattern as the web passes, by a process known as spiral spray. A pattern in which the adhesive only partially covers the nonwoven layers, such as is produced by melt-blowing or spiral spray, can result in a uniform, flat surface appearance of the composite fabric. By "only partially covers" it is meant that the adhesive is present at one part of the nonwoven but absent at an adjacent part. This can also be accomplished by applying a "dot matrix" pattern.

Figure 3A:
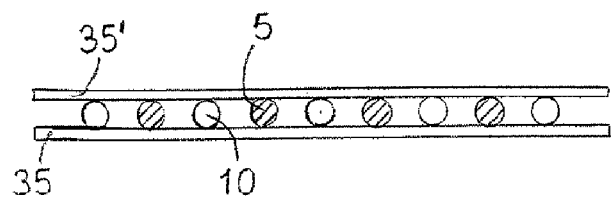
FIGS. 3A and 3B are schematic representations in cross-section of a functional stretch laminate of the invention, illustrating a sandwich of stretch and recovery elements and functional elements between two fabrics or sheets of other inextensible material.
Figure 3B:
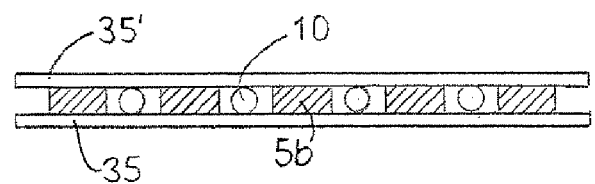

FIG. 3A and FIG. 3B illustrate functional laminate structures with different functional elements 5 and 5b. In FIG. 3A, functional element 5 is a copper wire. In FIG. 3B, functional element 5b is ribbon wire. In FIGS. 3A and 3B, elastomeric fibers 10 and nonwoven fabrics 35 and 35' are as described for FIGS. 1 and 2.

Figure 4A:
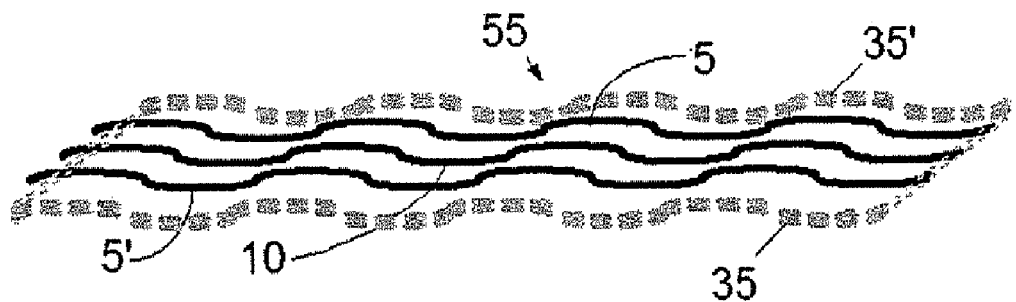
FIGS. 4A and 4B are schematic representations of an edge sectional view of a composite fabric used in a functional stretch laminate of the invention.
Figure 4B:
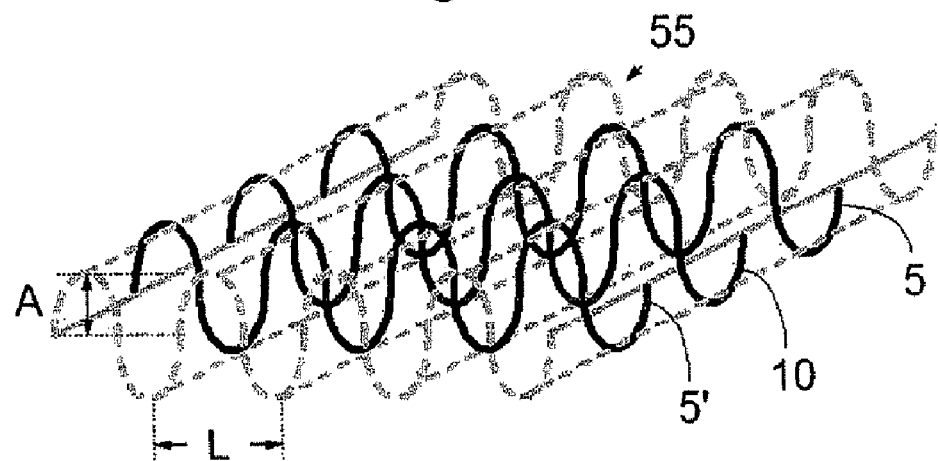

The flatness or smoothness of functional stretch laminates of this invention can be determined by measuring the change in thickness when the functional laminate is stretched from its relaxed state to its ultimate elongation. Generally, the smoother the appearance of the fabric, the smaller the change in thickness on stretching. Alternatively, one can count the number of raised portions, referred to as puckers, per linear cm (inch) of the relaxed functional stretch laminate fabric (L in FIG. 4B shows a distance between puckers). Starting from a given extended length, as the number of puckers increases in the relaxed fabric, the amplitude (A in FIG. 4B) of each pucker decreases. The ratio of these the two values, amplitude (A) and puckers per linear fixed length (L) (see FIG. 4B), i.e., the ratio of percent decrease in thickness to the number of puckers per inch, is referred to as the "flatness factor." The functional stretch laminate can be considered "flat" or "smooth" when the flatness factor is less than about 5.

Thickness measurements were made with an Ames Thickness Gage. Thickness was measured on the relaxed composite fabric at three different places and the measurements averaged. The fabric was then stretched to the fullest extent possible. While stretched, the thickness was again measured at three different places and the results were averaged. From the difference in thickness values, percent decrease in thickness was calculated.

The number of puckers per linear fixed length for the functional stretch laminate was determined by placing a ruler along the length of the fabric parallel to the edge of the fabric. The number of puckers in a fixed length were counted. This was repeated at two other locations across the width of the fabric. The average of these three measurements was recorded.

Another useful measurement is the "retractive force" of the functional stretch laminate. For Examples of the invention described below, the retractive force of the functional stretch laminate was measured as follows: 7.62 cm (three-inch) long samples of the relaxed stretchable fabric were elongated in an Instron instrument, model 1122, at a rate of 15.2 cm/min (6 in/min), The retractive force was recorded when the length extension reached 50%, that is, when the total length was 150% of the original length. The results were recorded as pounds per inch of fabric width (the apparatus was calibrated to convert total 0.4536 kg (pounds) to 0.4536 kg (pounds) per 2.54 cm (inch) width for fabrics that were wider than one 2.54 cm (inch)).

The functional stretch laminate may be "laundry durable" meaning that it can undergo at least one laundry cycle without showing evidence of delamination of the outer layers (whether polypropylene or polyester fiber-based nonwovens), which would indicate loss of bonding between the stretch and recovery element(s) and the outer layers. The functional stretch laminate may also be disposable, for example, when at least one of the outer layers comprises paper.

The functional stretch laminate fabric may, in certain embodiments, be further characterized by laundry durability such that it can undergo at least about 28 laundry cycles without showing evidence of delamination of the outer layers. To demonstrate such durability, the following laundry cycle was used: 30-minute warm wash/warm rinse with 38-41° C. (100-105° F.). water and 50 g of "Tide" detergent in a Sears Kenmore Series 80 washer, followed by drying on the "normal/permanent press/medium" setting (up to 96° C. [(205° F.]) in a Sears Kenmore Series 80 dryer.

The laundry durability of these functional stretch laminate fabrics incorporating spandex as the stretch and recovery element can be provided by using selected adhesives having a complex viscosity at 120° C. of: (i) at least about 25 pascal seconds (250 poise) when the outer layers comprise nonwoven fabric that comprises polypropylene fibers; and (ii) at least about 200 pascal seconds (2,000 poise) when the outer layers comprise nonwoven fabric that comprises polyester fibers.

The absolute value of the complex viscosity is defined as follows:

At a given frequency, ω, and shear stress, σ, the absolute value of the complex viscosity, $|\eta^*|$, is the square root of the sum of the squares of the elastic, (G'), and viscous, (G"), moduli divided by the frequency:

$$|\eta^*| = \sqrt{G'^2 + G''^2}/\omega$$

The softening point of useful adhesives can generally be expected to exceed 90° C. (194° F.) and suitably can generally be expected to exceed 110° C. (230° F.).

Examples of adhesives useful in making laundry durable functional stretch laminate fabrics include those that contain styrene-based block copolymers, which may also contain additives, such as tackifying agents and processing oils. Where the nonwoven fabrics comprise polypropylene fibers, the adhesives can include HL-1486 and HL-1470 (H. B. Fuller Company), and H-2104 and H-2494 (Bostick, Inc., Milwaukee, Wis.). Where the nonwoven fabrics comprise polyester and/or polypropylene fibers, the adhesives can include H-2385 (Bostick, Inc., Milwaukee, Wis.) and NS-34-3260, NS-34-3322, and NS-34-5640 (National Starch Company). All of the above-named adhesives contain styrene-based block copolymers. The complex viscosity of selected adhesives that are useful in making the laundry-durable functional stretch laminate fabrics of the invention are disclosed in EP1 128 952 B1 (granted 20031126 and assigned to E. I. DuPont de Nemours and Co.), the entire disclosure of which is incorporated herein by reference. Notably, it was found that use of HL-8130 (H. B. Fuller Company), complex viscosity at 120° C. of 15 pascal seconds, less than the minimum required 25 pascal seconds, did not result in laundry-durable stretchable fabrics with either polyester- or polypropylene-based nonwovens.

Figure 5A:
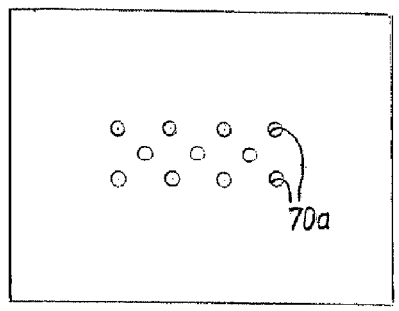
FIGS. 5A-5D are top plan views of perforation patterns that may be used to form perforations in an outer sheet of the composite stretch laminate to expose functional elements.
Figure 5B:
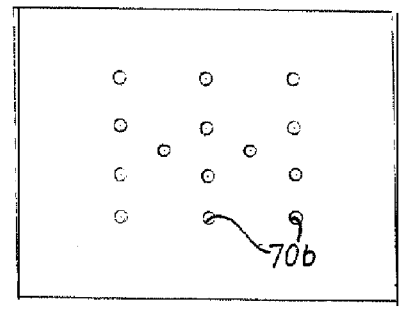
Figure 5C:
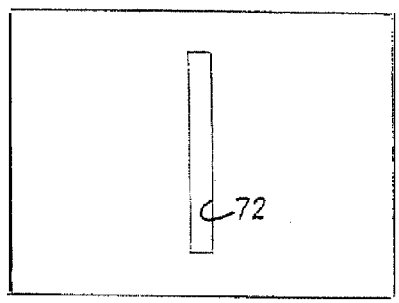
Figure 5D:
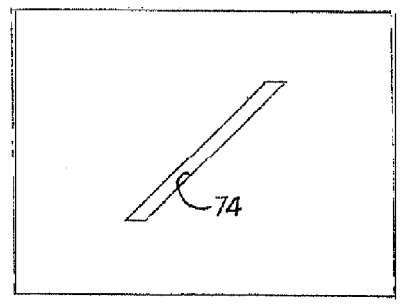

FIGS. 5A through 5D are top plan views of perforation patterns that may be used in conjunction with the invention. In FIG. 5A, a series of eleven round hole perforations 70a are formed in a regular grid pattern. In FIG. 5B, a series of fourteen round hole perforations 70b are formed an alternate regular grid pattern. In FIG. 5C, a rectangular slot perforation 72 is shown, oriented with its longest side generally perpendicular to the lengthwise-extension of the sheet holding such pattern and thus generally perpendicular to the extended length of the functional element. In FIG. 5D, a trapezoidal slot perforation 74 is shown, oriented at a slant with respect to the lengthwise extension of the sheet holding such pattern. The pattern sheets in FIGS. 5A to 5D are representative of the types of patterns that may be employed. Other advantageous patterns may be designed to meet specific requirements. Preferably, the patterns are cut through one outer layer of the functional stretch laminate, either while the layer is held in a planarized and fixed position or prior to assembling such layer within the functional stretch laminate. Optionally, such patterns may be cut through both outer layers of the functional stretch laminate.

Figure 5E:
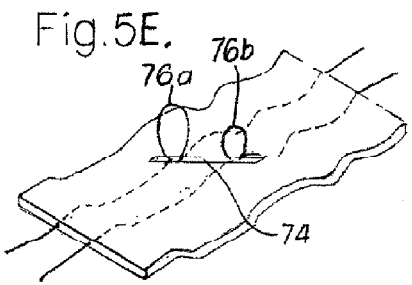
FIGS. 5E and 5F are perspective views of functional stretch laminates wherein portions of the functional elements loop out of one outer layer of the laminate.
Figure 5F:
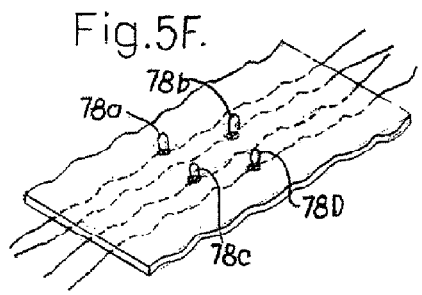

FIGS. 5E and 5F are perspective views of functional stretch laminates wherein portions of the functional elements loop out of one outer layer of the laminate. In FIG. 5E, two loops, 76a and 76b, are shown extending through an elongated slot-shaped perforation 74. In FIG. 5F, four loops, 78a, 78b, 78c, and 78d, are shown each extending through an individual perforation hole.

Figure 6A:
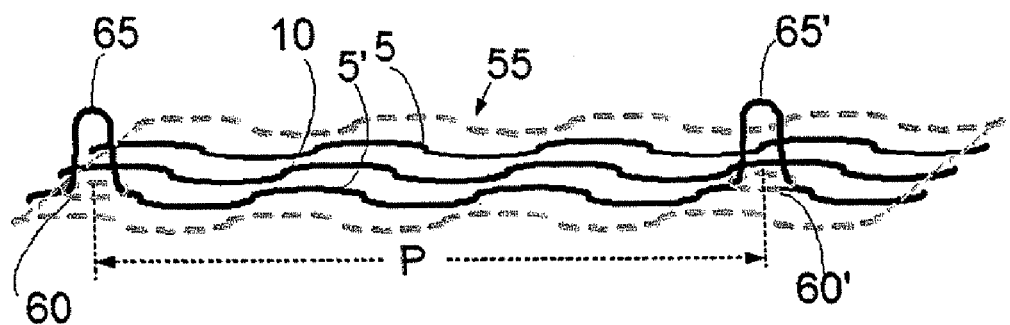
FIGS. 6A and 6B are schematic representations of an edge sectional view of a functional stretch laminate of the invention.
Figure 6B:
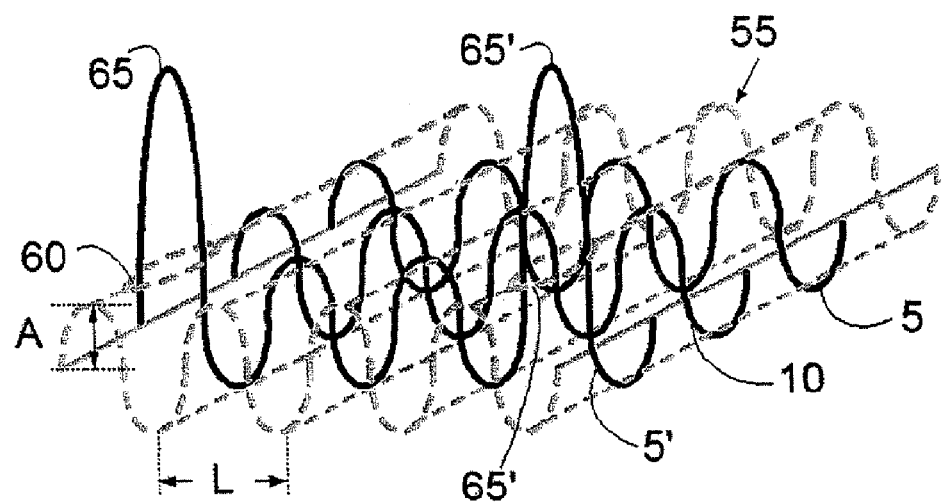

Referring next to FIGS. 6A and 6B, the perforations 60 and 60' in the outer layer create openings through which the functional elements may be exposed upon releasing tension and relaxing the laminate structure. Functional elements 5 and 5' within the laminate form loops 65 and 65' along portions of the length of the laminate. The functional elements 5 and 5' are coextensive with stretch and recovery element 10. The stretch laminate 55 is provided with perforations 60 and 60' in one of the nonwoven layers. These perforations are separated by a distance P which is defined for the laminate while under elongating tension. Any number of perforations 60, 60' may be present in one or both of the nonwoven layers. Generally, the distance P, separating perforations, is fixed along any portion of the total length of the laminate. The distance P may be tailored to provide access to one or more functional elements at chosen fixed intervals. Optionally, both nonwoven layers may contain perforations 60 and 60', which allow looping out of the functional elements 5 and 5' on opposing sides of the laminate. In FIGS. 6A and 6B the composite fabrics are shown in schematic representation in a relaxed state under no elongating tension. The looping out portions 65 and 65' of the functional elements 5, 5' extend a greater distance from the laminate under no elongating tension.

The degree that looping out portions 65 and 65' can project away from a via is at least, in part, a function of the bending modulus of the functional or conductive element. Conductive elements such as Silicone coated wire, Rea wire, Beadlon wire, FEP wire, or copper ribbon with higher bending modulus can dramatically protrude from the via as the laminate structure is relaxed. In contrast, softer conductive elements with a lower bending modulus, such as X-static, tend to remain in the plane of the non-woven, i.e., resting in the via for ease of access or termination.

Figure 7B:
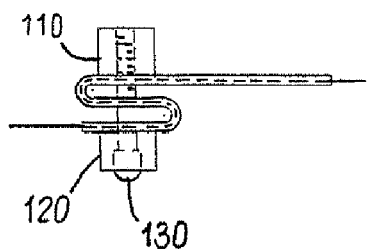
FIG. 7B is a cross-sectional view in side elevation of a clamping engagement to provide one possible electrical connection means at the z-fold formed at one end of the functional stretch laminate of FIG. 7A.
Figure 7A:
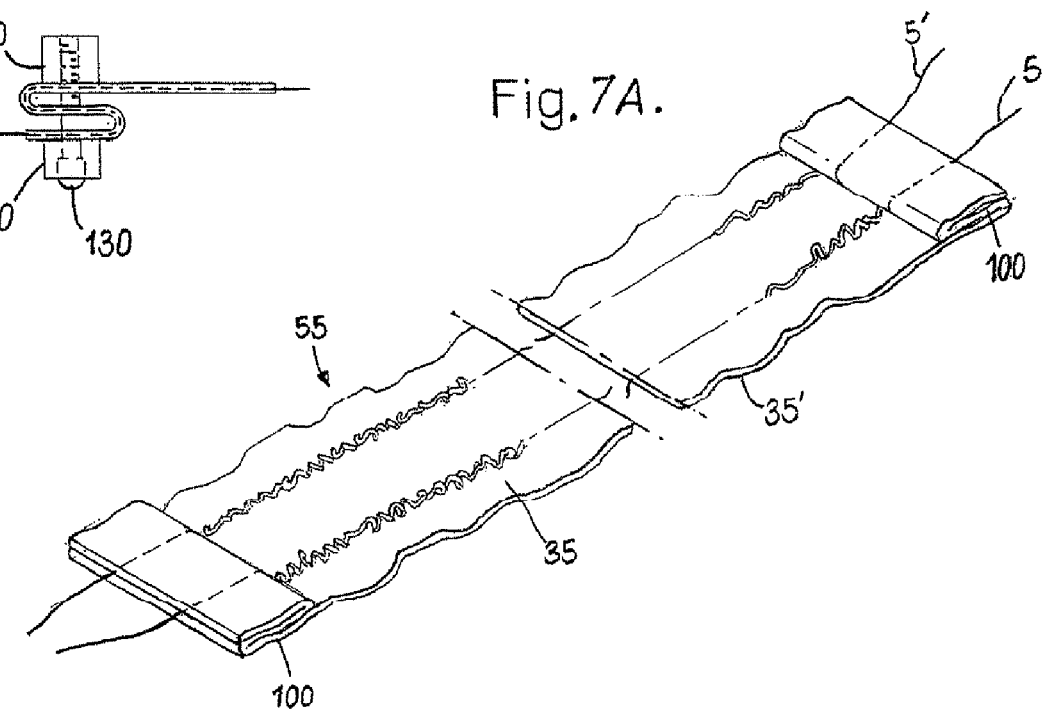
FIG. 7A is a perspective view of a functional stretch laminate of the invention in which z-folds are formed at each end to stabilize the functional element within the laminate.

FIG. 7A is a perspective view of a functional stretch laminate 55 of the invention comprised of two nonwoven fabrics, 35 and 35', and having two functional elements, 5 and 5', coextensive with stretch and recovery element (not shown in FIG. 7A) and including a folded over portion 100 or z-fold at each end. The folded over portion 100 functions as a strain relief, to help maintain the functional elements within the laminate structure.

The folded over portion 100 also permits a connector means to be clamped about the folded over portion. In FIG. 7B, an end portion of a laminate is represented in cross-section includes a clamping means comprising a first portion 110 and a second portion 120. The first portion 110 of the clamping means is provided with at least a pair of threaded holes each adapted to receive the threads of a bolt 130, which passes through the second portion of the clamping means 120 and engages the threads of portion 110. In FIG. 7B, the two portions of the clamping means 120 and 110, represented in cross-section, are completely engaged by means of the threaded bolts and provide a tight clamping of the folded over portion of laminate 55.

The invention is further illustrated in view of the Examples below.

EXAMPLES

The samples in these examples were made using a brand of spandex identified as 1520 decitex Lycra® XA® (Lycra® is a registered trademark of INVISTA S. à r. l., a private limited company of Luxembourg with offices at 4123 East 37th Street North, Wichita, Kans. 67220, USA) and a nonwoven fabric of polypropylene fibers (obtained from Perkins Sales Inc., Edisto Island S.C., USA 29438), having a basis weight of 15 g/m$^2$.

The functional or conductive element in the structures of the Examples were: in Example 1, Xstatic® yarns (obtained from SAUQUOIT Industries, Inc., Scranton, Pa., USA); in Example 2: (1) 29 gauge copper stranded wire coated with silicone; (2) 29 gauge copper stranded wire coated with a hard, black-colored FEP coating; (3) "BEADALON" Professional Series bead stringing wire, a nylon coated, 49 strand wire 0.013" or 0.33 mm available from BEADALON, West Chester, Pa., 19382; and (4) a gold colored 90 micron wire and a black colored 70 micron wire, which are insulated silver plated copper conductors (obtained from Elektro Feindraht, Escholzmatt, Switzerland) of diameters 0.040 mm-0.090 mm; in Example 3, single strand polyester and nylon insulated copper wire (obtained from Pelican Wire Company, Naples, Fla., USA) with sizes ranging from 38-42 AWG; and in Example 4, copper ribbon conductors having a rectangular cross section, with a 0.003 inch thickness and 0.0620 inch width (a product of Rea Magnet Wire, Inc., Fort Wayne, Ind., USA; obtained from Nicomatic North America, One Ivybrook Blvd, 20, Warminster, Pa., USA 18974). The physical properties of some of the above conductive elements were measured or obtained from each wire supplier and are summarized in Table 1.

TABLE 1

| Wire Source | Color | AWG | Diameter (millimeters) | Resistance in Ohms | INSTRON Break (grams force) |
|---|---|---|---|---|---|
| [1]Pelican | red | 42 | 0.064 | 2.3 | 85.30 |
| [1]Pelican | green | 40 | 0.079 | 1.4 | 121.21 |
| [1]Pelican | blue | 38 | 0.102 | 0.9 | 225.68 |
| [2]Elektro-Feindraht | gold | 39 | 0.090 | 1.0 | 144.17 |
| [2]Elektro-Feindraht | black | 41 | 0.071 | 1.7 | 110.57 |
| [2]Elektro-Feindraht | violet | 44 | 0.050 | 2.8 | 49.73 |

TABLE 1-continued

| Wire Source | Color | AWG | Diameter (millimeters) | Resistance in Ohms | INSTRON Break (grams force) |
|---|---|---|---|---|---|
| [2]Elektro-Feindraht | blue | 46 | 0.040 | 3.8 | 30.33 |

[1]Pelican Wire Company, Inc. 6266 Taylor Rd. Naples, FL 34109-1839
[2]Elektro-Feindraht AG 6182 Escholzmatt Switzerland Each of the test samples was washed as described below and repeatedly stretched using the Zwick Textile Fatigue Testing Machine (530 I; 8 position, after De Mattia). The Zwick testing machine is available from Zwick Testing Machines Ltd., Southern Avenue, Leominster, Herefordshire HR6 OQH, UK. The electrical resistance or conductivity was measured, in the manner known to those skilled in the art of electrical measurement, before and after each Zwick textile fatigue test. The wash durability testing method was comprised of a machine wash cycle with warm (40° C.) water and a cold rinse (room temperature water) using American Association of Textile Chemists and Colorists (AATCC) WOB Standard Powder Detergent with a hanging to dryness phase at room temperature.

Example 1

Part A

In Example 1, Part A, a 5 cm wide functional stretch laminate was prepared using the apparatus schematically represented in FIG. 1. The stretch laminate had 3 conductive Xstatic® yarns (a conductive yarn obtained from SAUQUOIT Industries, Inc., PO Box 3807, 300 Palm Street, Scranton, Pa., 18505, USA, which was based on a 70 denier, 34 filament nylon available from INVISTA S. à r. l (product ID number 70-XS-34×2 TEX 5Z)) and 22 LYCRA® spandex threads. The spandex and the conductive yarn were supplied from rolls to the apparatus illustrated in FIG. 1 and the spandex threads were placed substantially parallel and equidistant from each. The Xstatic® yarns were laid over the LYCRA® spandex in positions 4, 11, and 18 of the 22 spandex threads, which were on a pitch of about 2 millimeters. The spandex was stretched to not less than 100% and bonded between two layers of the nonwoven fabric with a hot melt adhesive. The two layers of nonwoven fabric were supplied by rolls to the apparatus shown in FIG. 1 (see, for example, the rolls 33 and 33') under sufficient tension to effectively planarize the two nonwoven fabrics. The conductive element was in its relaxed state under no tension and was introduced into the structure by contact with the stretched spandex before the adhesive was introduced.

For all samples, the adhesive was melt blown onto the spandex just before contacting the bottom layer of nonwoven fabric. For all samples, a styrene/isoprene block copolymer-based adhesive, H-2766, was used (product of Bostik Findley Inc., Wawatosa, Wis., USA), at 86.4 g/min. The adhesive was applied at 149° C. The speed of the samples entering a pair of nip rollers (substantially the same as schematically represented by nip rolls 50 in FIG. 1) was 300 ft/min (91.5 m/min), the nip roll pressure was 60 psi (414 kPascal). The top and bottom layers of nonwoven fabric and the intervening spandex and conductive filaments became adhesively bonded by this process, followed by removal of the tension on the spandex. Following the removal of the tension on the spandex, a puckered fabric was produced having a substantially uniform flat surface appearance due to small and substantially uniform puckers.

Table 2 contains the electrical resistance data for samples of the functional stretch laminate of Example 1, Part A. Wash testing of the sample showed no profound change in DC electrical resistance for each individual conductive element, other than a small increase to less two times the before washing resistance. The Zwick fatigue test of ten thousand (10,000) repeat cycles showed no failure of the individual conductive elements.

TABLE 2

Wash Testing (51 inch long sample with 3 conductors)

| Conductor | Before Wash Resistance (ohms) | After Wash Resistance (ohms) |
|---|---|---|
| conductor # 1 | 0.952K | 1.520K |
| conductor # 2 | 1.033K | 1.634K |
| conductor # 3 | 0.817K | 1.574K |

Zwick Test (two 6.5 inch samples folded & twisted into a figure-of-8)

| | Resistance (ohms) before Zwick Test | Resistance (ohms) after Zwick Test of 10,000 cycles |
|---|---|---|
| Sample 1 | | |
| conductor # 1 | 0.116K | 0.138K |
| conductor # 2 | 0.107K | 0.134K |
| conductor # 3 | 0.130K | 0.155K |
| Sample 2 | | |
| conductor # 1 | 0.135K | 0.156K |
| conductor # 2 | 0.105K | 0.135K |
| conductor # 3 | 0.135K | 0.202K |

Example 1

Part B

Example 1, Part B, was carried out using Xstatic® yarns as the conductive element in the functional stretch laminate. Two samples were made in Example 1, Part B precisely in the same process as that described for Example 1, Part A. In this Part B example, 12 LYCRA® spandex threads were used and Xstatic® yarns were inserted in positions 2, 3, 4, 5, 8, 9, 10 and 11, thereby overlaying 8 of the 12 LYCRA® spandex threads respectively. The resulting functional stretch laminate was about 2.5 cm in width. Two samples were prepared in the Part B trials and a 15 inch long sample of each was measured for resistance, as before, and washed tested in the same manner. Each of the 8 conductors was tested after 10 wash cycles.

As shown by Tables 3A and 3B, the resistance for each conductor increased only slightly, and no conductive element was damaged by the washing treatment. As a result, the functional stretch laminate produced in this way is sufficiently robust to endure normal laundry conditions and still maintain its useful electrical conduction.

TABLE 3A

Sample 1 Wash Test (15 inch sample)

| Conductor Identification | Resistance (ohms) before wash | Resistance (ohms) after 10 washings |
|---|---|---|
| thread # 1 | 243 | 360 |
| thread # 2 | 226 | 273 |
| thread # 3 | 204 | 235 |
| thread # 4 | 237 | 323 |
| thread # 5 | 130 | 163 |
| thread # 6 | 148 | 156 |
| thread # 7 | 275 | 327 |
| thread # 8 | 210 | 281 |

TABLE 3B

Sample 2 Wash Test (15 inch sample)

| Conductor Identification | Resistance before wash (ohms) | Resistance after 10 wash (ohms) |
|---|---|---|
| thread # 1 | 207 | 284 |
| thread # 2 | 208 | 317 |
| thread # 3 | 150 | 282 |
| thread # 4 | 159 | 299 |
| thread # 5 | 233 | 328 |
| thread # 6 | 205 | 290 |
| thread # 7 | 178 | 275 |
| thread # 8 | 230 | 392 |

Example 2

In Example 2, a 2.5 cm wide functional stretch laminate was prepared as in Example 1, except 19 LYCRA® spandex threads were placed substantially equidistant and parallel and, in four separate functional stretch laminates, the following functional elements were placed alongside of the LYCRA® spandex threads in positions 2 and 10: (1) in the first functional stretch laminate, 29 gauge copper stranded wire coated with silicone; (2) in the second functional stretch laminate, 29 gauge copper stranded wire coated with a hard, black-colored FEP coating; (3) in the third functional stretch laminate, "BEADALON" Professional Series bead stringing wire, a nylon coated, 49 strand wire 0.013" or 0.33 mm available from BEADALON, West Chester, Pa., 19382; and (4) in the fourth functional stretch laminate, a gold colored 90 micron wire and a black colored 70 micron wire. Three samples of each functional stretch laminate were prepared, each containing one of the four functional elements (for a total of twelve samples). Each sample was tested using the Zwick fatigue tester for ten thousand (10,000) cycles. For the samples using one of the first three functional elements, two six inch long functional stretch laminates were folded at 75% stretch. For samples using the fourth functional element, two six and a half inch long conducive stretch laminates were folded and twisted into a figure eight. The resistance of each conductive element was tested before and after Zwick testing.

The results in Table 4 show that each of the samples prepared with the first three functional elements were able to endure the Zwick test procedure. However, the samples prepared with the fourth functional element did not endure the Zwick test procedure (as a result of the wires breaking as opposed to destruction of the stretch laminate itself).

TABLE 4

Zwick Test Results

| Sample | Identification (Functional Element) | Resistance (ohms) before Zwick test | Resistance (ohms) after Zwick test of 10,000 cycles |
|---|---|---|---|
| Laminate #1 | Silicone coated copper wire | 1.0 | 0.7 |
| Laminate #2 | Silicone coated copper wire | 1.0 | 0.7 |
| Laminate #3 | Silicone coated copper wire | 1.0 | 0.6 |
| Laminate #4 | FEP coated copper wire | 1.0 | 0.5 |
| Laminate #5 | FEP coated copper wire | 1.0 | 0.5 |
| Laminate #6 | FEP coated copper wire | 0.8 | 0.5 |
| Laminate #7 | BEADALON wire | 14.3 | 12.0 |
| Laminate #8 | BEADALON wire | 13.4 | 11.7 |
| Laminate #9 | BEADALON wire | 13.4 | 11.6 |
| Laminate #10 | wire-gold & black | gold: 2.0 black: 3.9 | no conductivity, wire broken |
| Laminate #11 | wire-gold & black | gold: 3.4 black: 6.1 | no conductivity, wire broken |
| Laminate #12 | wire-gold & black | gold: 4.1 black: 4.8 | no conductivity, wire broken |

Example 3

In Example 3, functional stretch laminates were prepared as in Example 1. The Example 3 functional stretch laminates had either 4 or 8 conductive elements comprised of insulated silver-plated single strand copper wires. These wires are described by their respective colors given in Table 1. Where there were 4 conductive elements, they were introduced to the functional stretch laminate in positions 2, 5, 8, and 11 of the 12 LYCRA® spandex yarns. Where there were 8 conductive elements, they were introduced to the functional stretch laminate in positions 1, 3, 4, 6, 7, 9, 10, and 12 of the 12 LYCRA® spandex yarns. The resulting functional stretch laminate was about 2.5 cm wide. After being subjected to the wash test described for Example 1, the functional stretch laminate samples were subjected to the electrical resistance measurements as described above. In addition, the functional stretch laminate samples were subjected to electrical resistance measurements before and during elongation to 30% over the relaxed length of the laminate sample. Zwick fatigue test measurements were conducted as in the previous examples.

Tables 5 through 9 below summarize the test and measurement data for Example 3.

TABLE 5

| Sample 3A (8 conductors: red 42 AWG & green 40 AWG) | Resistance (ohms) before washing | Resistance (ohms) after 10 washings |
|---|---|---|
| Red wire # 1 | 8.6 | 7.9 |
| Green wire # 2 | 5.8 | failed |
| Green wire # 3 | 5.4 | failed |
| Red wire # 4 | 7.4 | 6.9 |
| Red wire # 5 | 8.9 | failed |
| Green wire # 6 | 7.6 | failed |
| Green wire # 7 | 5.0 | failed |
| Red wire # 8 | 7.5 | 7.5 |

TABLE 6

| Sample 3B (8 conductors: red 42 AWG & green 40 AWG) | Resistance (ohms) relaxed | Resistance (ohms) stretched 30% |
|---|---|---|
| Red wire # 1 | 2.3 | 2.3 |
| Green wire # 2 | 1.6 | 1.6 |
| Green wire # 3 | 1.8 | 1.8 |
| Red wire # 4 | 2.4 | 2.4 |
| Red wire # 5 | 2.5 | 2.5 |
| Green wire # 6 | 1.6 | 1.6 |
| Green wire # 7 | 1.7 | 1.7 |
| Red wire # 8 | 2.5 | 2.5 |

TABLE 7

| Sample 3C (blue 38 AWG) | Resistance (ohms) before washing | Resistance (ohms) after 10 washings |
|---|---|---|
| Blue wire # 1 | 4.6 | failed |
| Blue wire # 2 | 5.3 | 2.9 |
| Blue wire # 3 | 3.1 | 2.9 |
| Blue wire # 4 | 4.8 | 3.0 |

TABLE 8

| Sample 3D (blue 38 AWG) | Resistance (ohms) before washing | Resistance (ohms) after 10 washings |
|---|---|---|
| Blue wire # 1 | 3.0 | 3.1 |
| Blue wire # 2 | 4.0 | 3.0 |
| Blue wire # 3 | 4.8 | 2.9 |
| Blue wire # 4 | 3.1 | failed |

TABLE 9

| Sample 3C (blue 38 AWG) | Resistance (ohms) after Zwick 3000 cycles | Resistance (ohms) after Zwick 6000 cycles |
|---|---|---|
| Blue wire # 1 | 1.3 | No conductivity, failed test |
| Blue wire # 2 | No conductivity, failed test | No conductivity, failed test |
| Blue wire # 3 | No conductivity, failed test | No conductivity, failed test |
| Blue wire # 4 | No conductivity, failed test | No conductivity, failed test |

Example 4

In this example, a pair of uninsulated flat copper ribbons (measured in cross section: 0.003 inch by 0.062 inch) were used as the conductive element. A single twisted pair of LYCRA® spandex yarns comprised of two 1520 decitex Lycra® XA® threads was used as the stretch and recovery element. The Lycra® XA® was maintained in a draft of about 1.3 times while the conductive elements were inserted, with their widest dimension in the plane of the nonwoven fabrics, between the two nonwoven fabrics to form the functional stretch laminate. The process used for making the stretch laminate was otherwise substantially the same as that process used in previous examples. The resulting laminate was about 2.5 cm wide and the conductive elements about 1.5 cm apart, while the single twisted pair of LYCRA® spandex yarns was between the copper conductive elements. The laminate had a puckered appearance in the relaxed state characterized by a repeat length L of about 15 to 20 mm, as illustrated schematically in FIG. 4B.

Example 5

This example shows that the performance of a terminated laminate structure can be improved by folding the laminate structure at least once back on itself in a fold, and preferably at least twice in a z-fold, zig-zag or s-wrap configuration, and then securing the ends with a mechanical fastening system such as gluing, snapping, rivets, stitching, and/or staples, as shown, for example, in FIGS. 7A and 7B, which show a mechanical fastening system in the form of a clamping means.

The functional stretch laminates used for this example were each about one inch wide and eight inches long and otherwise made according to the method of Example 2 wherein the following functional elements were placed alongside of the LYCRA® spandex threads in positions 2 and 10: (1) in the first functional stretch laminate, 29 gauge copper stranded wire coated with silicone; (2) in the second functional stretch laminate, 29 gauge copper stranded wire coated with a hard, black-colored FEP coating; (3) in the third functional stretch laminate, "BEADALON" Professional Series bead stringing wire. A regular snap was used as the mechanical fastening system.

The above laminates were tested to determine the amount of force required to pull the functional elements from the laminate structure. The amount of force required to pull the functional elements from each laminate was determined by placing each laminate on an Instron pull force test machine in a room at 70° F. (21.1° C.) and 65% relative humidity. The instron pull force test machine was an Instron Model 5565 equipped with the Merlin data collection software system (both the Merlin system and instrument hardware are available from Instron Corporation (Braintree, Mass.)). A one inch+/−0.05 inch wide (2.54 cm+/−0.13 cm) and approximately 8 inch (20.32 cm) long sample of a stretch nonwoven sheet was clamped in the jaws of the Instron machine with a sample length set at 3.00 inches (7.62 cm). The sample was prepared such that the length of the sample was aligned with the direction of the spandex and/or functional element of the stretch nonwoven. The sample was elongated at a rate of six inches per minute (15.24 cm/min) until the sample broke into two portions and the maximum force in grams at the break point was recorded.

As shown in Table 10, laminate structure ends that have been folded on themselves and secured hold the functional elements more securely within the laminate structure. It can require between about 2 to 3 times the force to pull the functional/conductive elements from the structure, as compared to the force to pull standard unsecured conductive elements, which can be pulled from a glued laminate structure with a lowerpulling force.

TABLE 10

Pull Test Results
(unit lbs of force required to pull or break functional materials)

| Sample | Standard Configuration | Snapped S-Wrap Configuration | Glued S-Wrap Configuration |
|---|---|---|---|
| Laminate #1 (silicone coated copper wire) | 0.54 | 6.49 | 7.56 |

TABLE 10-continued

Pull Test Results
(unit lbs of force required to pull or break functional materials)

| Sample | Standard Configuration | Snapped S-Wrap Configuration | Glued S-Wrap Configuration |
|---|---|---|---|
| Laminate #2 (silicone coated copper wire) | 4.6 | 4.44 | 8.67 |
| Laminate #3 (FEP coated copper wire) | 3.09 | 7.38 | 10.95 |
| Laminate #4 (FEP coated copper wire) | 5.42 | 9.79 | 6.03 |
| Laminate #5 (BEADALON wire) | 6.62 | 14.61 | 20.67 |
| Laminate #6 (BEADALON wire) | 8.09 | 16.65 | 13.66 |

Example 6

This example provides a stretch laminate that is substantially identical to that of Example 4, except it has at least one modified outer layer. As in previous examples, copper-based conductive elements, wires, ribbons, and/or metallic plated yarns can be introduced between two non-woven layers along with a spandex yarn. The spandex is stretched to at least 100% and is bonded between two layers of the nonwoven fabric with a hot melt adhesive. The two layers of nonwoven fabric are, as in Example 1, supplied on rolls (such as 33 and 33' in FIG. 1) under sufficient tension to effectively planarize the two nonwoven fabrics. The conductive elements (copper ribbons) are in a relaxed state under no tension. The adhesive is melt blown onto the spandex just before contacting the bottom layer of nonwoven fabric.

In this example, perforations are provided in one of the outer layers at intervals along a path substantially co-linear with the one of the conductive elements, e.g. co-linear with at least one of the two copper ribbons. These perforations in the outer (nonwoven) layer are punctuated along the length of the nonwoven material. Such perforations are also known in the electrical and electronic arts as "vias" (vias are construed here to mean a through-passage communicating from one surface to another and through which a wire or functional element passes, so that the wire is underneath such via).

As shown in FIG. 5, the perforations can, for example, be geometric shaped rectangles or circular cross-sectionally shaped holes obtained by a "hole-punching" means. Any cross-sectional shape is generally suitable and is readily provided by a hole punch die having the desired shape. Hole-punching means can, for example, include a hand held device, which produces a single hole, and a 3-hole paper punch used to make 3-ring binder holes in paper. In general, such hole-punching means are used in a step-and-repeat fashion to make a series of holes of a fixed spacing interval in the non-woven.

Alternatively, the non-woven sheet may be fed through a dedicated hole punching apparatus capable of hole punching on a fixed spacing interval ("a fixed pitch", P, as shown in FIG. 6A) or on a randomly spaced interval selected by the operator. Alternately, the non-woven sheet may be scored. The non-woven sheet, so perforated or scored, can be wound up in a conventional manner to then be mounted in an apparatus (such as that shown in FIG. 1, in either or both of positions denoted as 33 or 33'). In an alternative embodiment, vias can be cut in any shape directly into multiple layer depths of an un-wound roll. The perforated non-woven can then used to form a functional stretch laminate, substantially as represented schematically in FIG. 6A, and in the relaxed form in FIG. 6B.

Nothing in this specification should be considered as limiting the scope of the present invention. All examples presented are representative and non-limiting. The above described embodiments of the invention may be modified or varied, and elements added or omitted, without departing from the invention, as appreciated by persons skilled in the art in light of the above teachings. It is therefore to be understood that the invention is to be measured by the scope of the claims, and may be practiced in alternative manners to those which have been specifically described in the specification.

The invention claimed is:

1. A functional stretch laminate, comprising:
   (a) a first outer layer of a fabric or film defining an inner surface and an outer surface and a length, and defining two or more perforations therethrough, with each perforation defining a hole opening with a maximum outer dimension;
   (b) a second outer layer of a fabric or film, said second layer defining an inner surface and an outer surface;
   (c) two or more threadlines of stretch and recovery elements extending along at least a portion of the length of the first outer layer;
   (d) two or more wires, yarns or strands of functional elements substantially parallel to or co-extending with the stretch and recovery elements, said functional elements having a threadline length and having an outer diameter or maximum outer width less than the maximum outer dimension of a corresponding perforation hole opening, with the stretch and recovery elements and functional elements sandwiched between the inner surfaces of the outer layers; and
   (e) at least one adhesive composition for bonding the stretch and recovery elements and the functional elements between the inner surfaces of the outer layers;
   wherein portions of one functional element are exposed to an environment outside of the laminate through the two or more perforations, and wherein a puckered appearance results when the stretch and recovery elements are in a relaxed or unstretched state.

2. The functional stretch laminate of claim 1, wherein when the stretch and recovery elements are in a relaxed or unstretched state, at least one portion of at least one functional element loops beyond the outer surface of the first outer layer through at least one of the perforations in a direction substantially perpendicular to a plane defined by the outer surface of the first outer layer, and at least one other portion of at least one functional element loops beyond the outer surface of the first outer layer through at least one other of the perforations in a direction substantially perpendicular to a plane defined by the outer surface of the first outer layer.

3. The functional stretch laminate of claim 1, wherein the functional elements are present in an amount from 1 to 20 per inch of width of the laminate.

4. The functional stretch laminate of claim 1, wherein the perforations are formed in the first outer layer at predetermined intervals along the length.

5. The functional stretch laminate of claim 1, wherein the perforations are formed in the first outer layer at predetermined intervals along the length before the stretch and recovery elements and functional elements are bonded between the first outer layer and second outer layer.

6. The functional stretch laminate of claim 1, wherein the perforations have a shape selected from the group consisting of a hole, a slit, a slot, and combinations thereof.

7. The functional stretch laminate of claim 2, wherein at least two functional elements loop beyond the outer surface of the first outer layer through the same perforation.

8. The functional stretch laminate of claim 1, wherein the retractive force of the laminate is at least 0.22 lb/in (38.9 g/cm) when the laminate is stretched to 150% of its original length.

9. The functional stretch laminate of claim 1, wherein the stretch and recovery elements comprise spandex.

10. The functional stretch laminate of claim 1, wherein the functional elements are selected from the group consisting of: insulated single and multi-stranded metallic wires, non-insulated single and multi-stranded metallic wires, metallic coated polymeric fibers, inherently conductive polymer fibers, plastic optical fiber, silica glass optical fibers, metallic coated films, and combinations thereof.

11. The functional stretch laminate of claim 1, wherein at least one functional element comprises at least one material having functional properties that is intermingled, twisted, core spun, or covered together with: (i) at least one other material having functional properties, or (ii) a material having stretch and recovery properties.

12. The functional stretch laminate of claim 11, wherein the material having stretch and recovery properties comprises spandex, and the material having functional properties is selected from the group consisting of metal wire, an electrically or optically functional composite yarn that comprises an elastic member surrounded by at least one functional covering filament, an electrically conductive elastomeric composition that exhibits variable resistance, and silver plated textile nylon filament.

13. The functional stretch laminate of claim 1, wherein the fabric or film outer layers are selected from the group consisting of nonwoven fabric, woven fabric, knit fabric, paper, and polymer film.

14. The functional stretch laminate of claim 1, wherein a distal end of the functional stretch laminate is folded back onto itself at least one time and such folded end is fastened to the outer surface of one outer layer.

15. The functional stretch laminate of claim 14, wherein the folded end is fastened by a mechanical fastening mechanism selected from the group consisting of gluing, riveting, snapping, stitching, stapling, welding, and encasing.

16. The functional stretch laminate of claim 1, wherein the laminate is adaptable for attachment to at least one connector, wherein said connector is adaptable for connecting the functional element in the laminate to a source selected from the group consisting of electricity and radiation.

17. A method for preparing a functional stretch laminate, comprising:
providing a length of a first piece of inextensible material having an inner surface and an outer surface and a length, and defining two or more perforations therethrough, with each perforation defining a hole opening with a maximum outer dimension;
providing a second piece of inextensible material having an inner surface and an outer surface,
extending two or more threadlines of stretch and recovery elements to at least 50% of their undeformed recoverable extension limit and fixing said stretch and recovery elements along at least a substantial portion of the length of the first piece of inextensible material,
extending two or more wires, yarns or strands of functional elements coextensively with the stretch and recovery elements and fixing said functional elements along at least a substantial portion of the length of the first piece of inextensible material, said functional elements having a threadline length and having an outer diameter or maximum outer width less than the maximum outer dimension of a corresponding perforation hole opening,
securing the extended stretch and recovery elements and the functional elements to the inner surface of said first piece of inextensible material along a substantial portion of the length thereof;
bonding the stretch and recovery elements and the functional elements between the inner surface of said first piece of inextensible material and the inner surface of the second piece of inextensible material to form the functional stretch laminate; and
relaxing the extended length of said stretch and recovery elements substantially and allowing the functional stretch laminate to pucker, such that portions of the functional elements are exposed to an environment outside of the laminate through the holes provided in the first piece of inextensible material.

18. The method of claim 17, wherein the stretch and recovery elements and the functional elements are substantially parallel when extended.

19. The method of claim 17, wherein the stretch and recovery elements comprise spandex.

20. The method of claim 17, wherein the functional elements are selected from the group consisting of: insulated single and multi-stranded metallic wires, noninsulated single and multi-stranded metallic wires, metallic coated polymeric fibers, inherently conductive polymer fibers, plastic optical fiber, silica glass optical fibers, and metallic coated films.

21. The method of claim 17, wherein the inextensible material is a fabric or film selected from the group consisting of nonwoven fabric, woven fabric, knit fabric, paper, and polymer film.

22. The method of claim 17, further comprising perforating the first piece of inextensible material to form the perforations before securing the extended stretch and recovery elements and the functional elements to the inner surface of the first piece of inextensible material.

23. The method of claim 22, wherein the hole opening is selected from the group consisting of a hole, a slit or a slot.

24. The method of claim 22, further comprising perforating the second piece of inextensible material to form one or more hole openings before securing the extended stretch and recovery elements and the functional elements to the second piece of inextensible material.

25. The method of claim 17, further comprising the steps of:
(i) folding a distal end of the functional stretch laminate back onto itself at least one time; and (ii) fastening such folded end to the outer surface of one piece of inextensible material.

26. The method of claim 25, wherein fastening is by a mechanical fastening mechanism selected from the group consisting of gluing, riveting, snapping, stitching, stapling, welding, and encasing.

27. The method of claim 17, further comprising the step of attaching at least one connector to the functional stretch laminate, wherein said connector is adaptable for connecting the at least one of the functional elements in the laminate to a source selected from the group consisting of: electricity and radiation.

28. A garment or wearable incorporating the functional stretch laminate of claim 1.

29. The functional stretch laminate of claim 1, wherein the second outer layer defines two or more perforations therethrough, and wherein at least a portion of another one of the two or more functional elements is exposed to an environment outside of the laminate through the two or more perforations of the second outer layer.

* * * * *

UNITED STATES PATENT AND TRADEMARK OFFICE
CERTIFICATE OF CORRECTION

| | | |
|---|---|---|
| PATENT NO. | : 8,263,215 B2 | Page 1 of 1 |
| APPLICATION NO. | : 12/853340 | |
| DATED | : September 11, 2012 | |
| INVENTOR(S) | : Stacey B. Burr et al. | |

It is certified that error appears in the above-identified patent and that said Letters Patent is hereby corrected as shown below:

Col. 22, Claim 27 should read as follows:

27. The method of claim 17, further comprising the step of attaching at least one connector to the functional stretch laminate, wherein said connector is adaptable for connecting [[the]] at least one of the functional elements in the laminate to a source selected from the group consisting of: electricity and radiation.

Signed and Sealed this
Thirtieth Day of October, 2012

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 8,263,215 B2 |
| APPLICATION NO. | : 12/853340 |
| DATED | : September 11, 2012 |
| INVENTOR(S) | : Stacey B. Burr et al. |

It is certified that error appears in the above-identified patent and that said Letters Patent is hereby corrected as shown below:

Col. 22, lines 62-67, Claim 27 should read as follows:

27. The method of claim 17, further comprising the step of attaching at least one connector to the functional stretch laminate, wherein said connector is adaptable for connecting [[the]] at least one of the functional elements in the laminate to a source selected from the group consisting of: electricity and radiation.

This certificate supersedes the Certificate of Correction issued October 30, 2012.

Signed and Sealed this
Fourth Day of December, 2012

David J. Kappos
*Director of the United States Patent and Trademark Office*